(12) United States Patent
Montgomery et al.

(10) Patent No.: US 11,227,819 B2
(45) Date of Patent: Jan. 18, 2022

(54) CASCODE SEMICONDUCTOR DEVICE AND METHOD OF MANUFACTURE

(71) Applicant: NEXPERIA B.V., Nijmegen (NL)

(72) Inventors: Robert James Montgomery, Nijmegen (NL); Ricardo Lagmay Yandoc, Nijmegen (NL)

(73) Assignee: Nexperia B.V., Nijmegen (NL)

(*) Notice: Subject to any disclaimer, the term of this patent is extended or adjusted under 35 U.S.C. 154(b) by 75 days.

(21) Appl. No.: 16/774,468

(22) Filed: Jan. 28, 2020

(65) Prior Publication Data
US 2020/0243426 A1   Jul. 30, 2020

(30) Foreign Application Priority Data

Jan. 29, 2019  (EP) .................................... 19154242

(51) Int. Cl.
| | | |
|---|---|---|
| *H01L 21/02* | (2006.01) | |
| *H01L 23/495* | (2006.01) | |
| *H01L 23/00* | (2006.01) | |
| *H03K 17/10* | (2006.01) | |
| *H03K 17/687* | (2006.01) | |

(52) U.S. Cl.
CPC .... *H01L 23/49562* (2013.01); *H01L 23/4951* (2013.01); *H01L 24/05* (2013.01); *H03K 17/107* (2013.01); *H03K 17/687* (2013.01); *H01L 2924/13064* (2013.01)

(58) Field of Classification Search
CPC combination set(s) only.
See application file for complete search history.

(56) References Cited

U.S. PATENT DOCUMENTS

| | | | |
|---|---|---|---|
| 9,083,343 B1* | 7/2015 | Li .......................... | H03K 17/567 |
| 2014/0167822 A1* | 6/2014 | Rutter ................. | H01L 23/4824 |
| | | | 327/109 |
| 2016/0086878 A1* | 3/2016 | Otremba ............... | H01L 29/778 |
| | | | 257/139 |
| 2017/0025336 A1 | 1/2017 | Padmanabhan et al. | |

FOREIGN PATENT DOCUMENTS

EP      3149852 A1    4/2017

OTHER PUBLICATIONS

European Search Report for corresponding application EP19154242. 2, dated Jul. 19, 2019, 9 pages.

* cited by examiner

*Primary Examiner* — Niki H Nguyen
(74) *Attorney, Agent, or Firm* — Ohlandt, Greeley, Ruggiero & Perle, LLP

(57) ABSTRACT

This disclosure relates to a discrete semiconductor device and associated method of manufacture, the discrete semiconductor device includes: a high voltage depletion mode device die; and a low voltage enhancement mode device die connected in cascode configuration with the high voltage depletion mode device die. The high voltage depletion mode device includes a gate, source and drain terminals arranged on a first surface thereof and the gate source and drain terminals are inverted with respect to the low voltage enhancement mode device die and the low voltage device is arranged adjacent to the high voltage device.

18 Claims, 10 Drawing Sheets

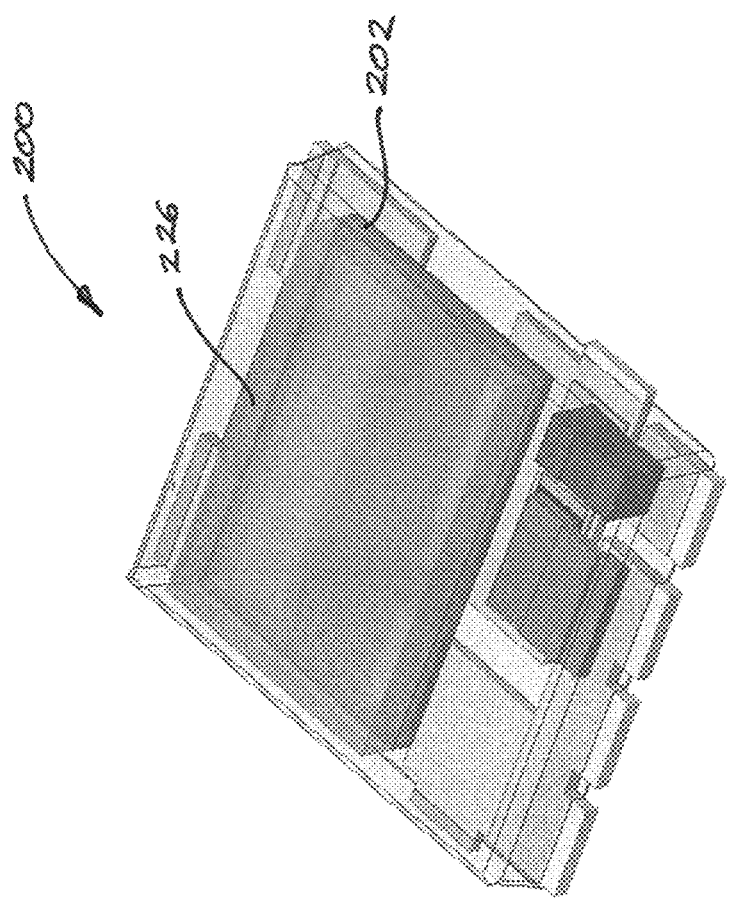

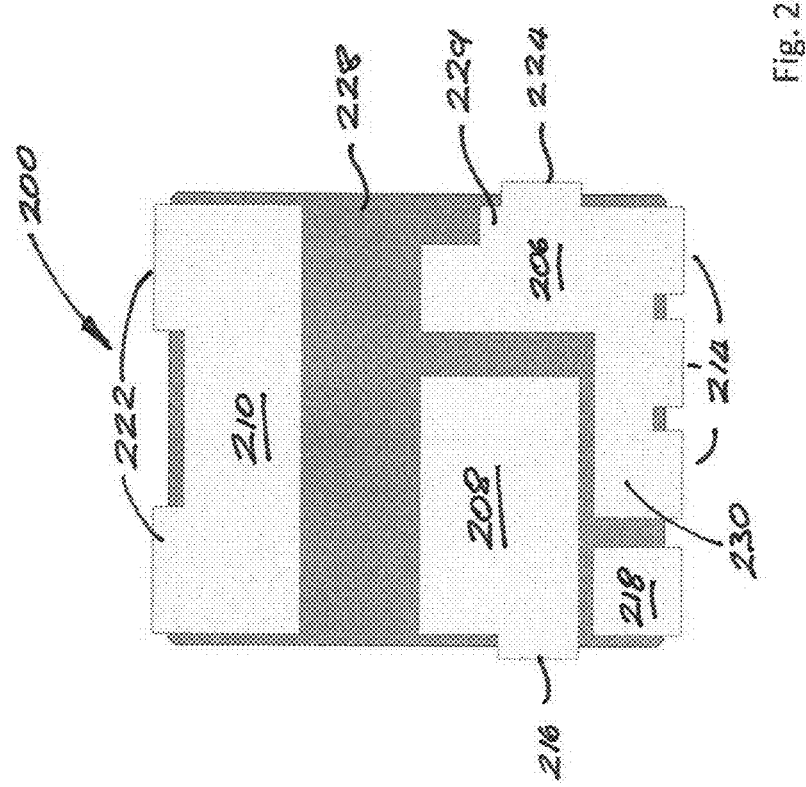

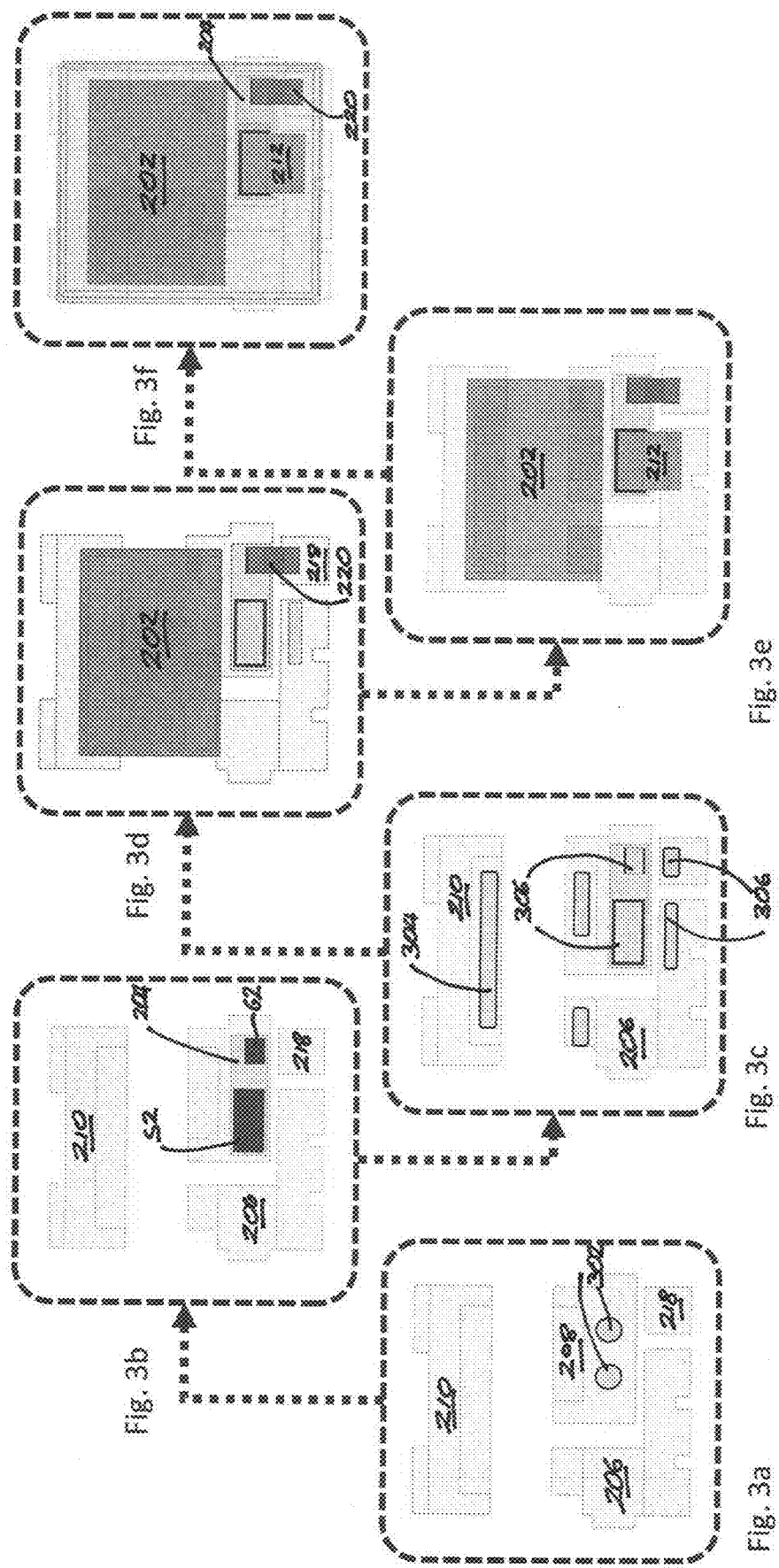

CASCODE SEMICONDUCTOR DEVICE AND METHOD OF MANUFACTURE

This application claims the benefit under 35 U.S.C. § 119(a) of European Application No. 19154242.2 filed Jan. 29, 2019 the contents of which are incorporated by reference herein in their entirety.

BACKGROUND OF THE DISCLOSURE

1. Field of the Disclosure

The present disclosure relates to semiconductor device. In particular this disclosure relates to a cascode arrangement of a depletion mode transistor die and an enhancement mode transistor die.

2. Description of the Related Art

Cascode arrangements of transistors are well known, in particular for controlling normally on (or depletion mode) at zero gate-source voltage, high voltage semiconductor devices. Cascode arrangements can be used in switched mode, especially in power supplies where efficient energy switching is required. Typically, as illustrated in FIG. 1, a normally off (or enhancement mode) low voltage device is placed in series with a high voltage depletion mode device, by connecting a gate of the high voltage device to a source of the low voltage device, and a drain of the low voltage device to the source of the high voltage device. The high voltage device can thus be switched off when the drain source voltage of the low voltage device reaches the threshold voltage of the high voltage device. The addition of a low voltage device therefore allows the normally on high voltage device to operate as a normally off device.

Typically, the high voltage depletion mode device may be a Gallium Nitride (GaN) or Silicon Carbide (SiC) based JFET or HEMT, and the low voltage enhancement mode device may be a silicon (Si) based MOSFET and both the high and low voltage device are integrated into a single semiconductor device package.

Where both high and low voltage devices are integrated into a single semiconductor device package, it is common to mount the high voltage device on to a carrier, such as a lead frame or a printed circuit board (PCB). The low voltage device is then mounted, or stacked, on the high voltage device. However, such mounting requires the use of an insulating material between the carrier and the high voltage device to electrically insulate the high voltage device from the carrier. The insulating material may be a ceramic material. Ceramic based insulators are preferred over glass or porcelain insulators because they are more robust at high operating temperatures. In addition, ceramic is also compatible with copper deposition processes to form so-called direct bond copper (DBC) substrates.

Furthermore, the above mentioned cascode device connections between the respective gate, source and drain of the high and low voltage devices are currently formed by wire bonds. Such wire bond connections suffer from the problem of DC power and switching losses due to the inductance effects in the wires during operation. Using wire-bonded connections can result in higher parasitic inductances and capacitances, which can result in so-called gate bounce. Gate bounce is a false turn on mechanism where during high frequency switching operation, the high voltage device is switched to an "on" state when it should be in an "off" state. Furthermore, device resistances such as $R_{DSon}$ may increase and wire connections can be subject to failure particularly at high voltage operation of the high voltage device.

SUMMARY

Various example embodiments are directed to issues such as those addressed above and/or others which may become apparent from the following disclosure concerning improving the electrical and thermal performance of cascode connected high voltage and low voltage transistors.

In certain example embodiments, aspects of the present disclosure involve the placement of a high voltage transistor die with respect to the low voltage transistor die in a cascode arrangement and the manner of the electrical connections therebetween.

According to an embodiment there is provided a discrete semiconductor device comprising: a high voltage depletion mode device die; a low voltage enhancement mode device die connected in cascode configuration with the high voltage depletion mode device die; wherein the high voltage depletion mode device comprises gate, source and drain terminals arranged on a first surface thereof and the gate source and drain terminals are inverted with respect to the low voltage enhancement mode device die; and wherein the low voltage device is arranged adjacent to the high voltage device.

The high voltage depletion mode device may be a lateral device and the low voltage device is a vertical device.

The source terminal of the high voltage device die and the drain terminal of the low voltage device die may be fixedly and electrically connected to a common bond pad.

The gate terminal of the high voltage device die and a source terminal of the low voltage device die may be electrically connected by a conductive clip member.

The conductive clip member may be fixedly and electrically connected to the source terminal of the low voltage device and fixedly and electrically connected to the gate of the high voltage device.

Optionally, a ferrite element may be fixedly and electrically connected to the gate terminal of the low voltage device die and a gate lead of the of the semiconductor device.

The high voltage device die may be either a GaN based transistor, a GaN based HEMT or a SiC transistor. The low-voltage enhancement-mode transistor may be a field effect transistor.

According to an embodiment there is also provided a method of manufacturing a discrete semiconductor device, the method comprising: providing a high voltage depletion mode device die having gate, source and drain terminals formed on a first surface thereof; providing a low voltage enhancement mode device die connected in cascode configuration with the high voltage depletion mode device die; mounting the high voltage depletion mode device such that the gate source and drain terminals are inverted with respect to the low voltage enhancement mode device die; and arranging the low voltage device adjacent the high voltage device.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale. Advantages of the subject matter claimed will become apparent to those skilled in the art upon reading this description in conjunction with the accompanying figures, in which like reference numerals have been used to designate like elements, and in which:

FIG. 2b illustrates an isometric view of the semiconductor device according to embodiments and comprising a heat sink element.

FIG. 2c illustrates a bottom view of the semiconductor device according to embodiments.

FIGS. 3a to 3f illustrate the various steps in an example process flow for assembling the semiconductor device according to embodiments.

DETAILED DESCRIPTION

In the following description of embodiments, the high voltage device die may be selected from a GaN based transistor, a GaN based HEMT or a SiC based transistor, and the low voltage device die may be field effect transistor.

Figure 2A:
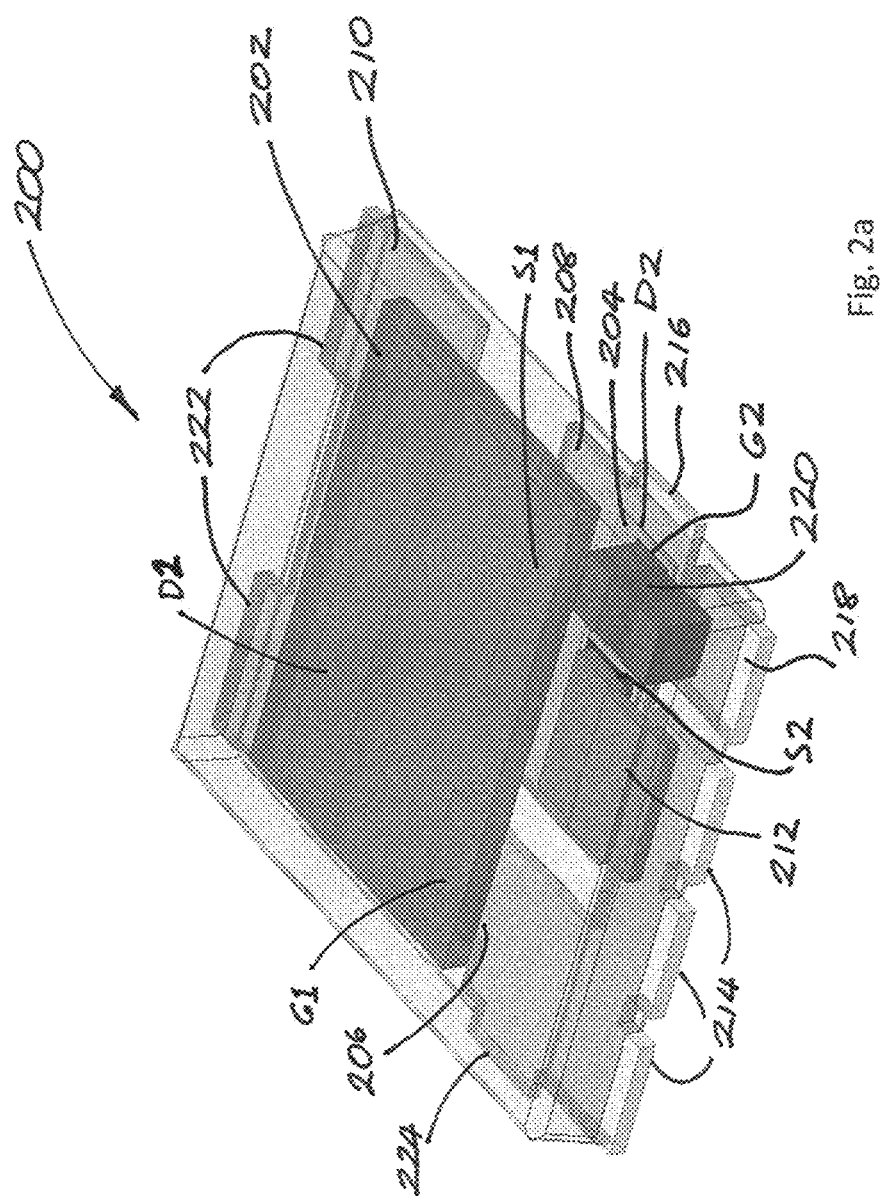
FIG. 2a illustrates an isometric view of the semiconductor device according to embodiments.

FIG. 2a illustrates a semiconductor device 200 according to an embodiment. The semiconductor device 200 comprises a high voltage device 202 and a low voltage device 204. The high voltage device 202 may be a depletion mode, or normally on, HEMT or JFET and may for example be a GaN or SiC based device. The low voltage device 204 may be an enhancement mode, or normally off, MOSFET.

The high voltage device 202 and low voltage device 204 as described above are separate device dies. The high voltage and low voltage devices 202, 204 are configured and integrated within a single package to form the semiconductor device 200 according to embodiments.

High voltage devices 202, such as HEMTs are formed with gate, source and drain terminals on a top surface thereof and are thus considered to be lateral devices, as opposed to vertical devices where at least one of the terminals is formed on a bottom surface, opposite to the top surface.

The semiconductor device 200 comprises various contact pads for mounting each of the high and low voltage devices 202, 204 and making electrical connections to the terminals of those devices. With regard to the high voltage device 202, a gate terminal G1 thereof is electrically connected to and mounted upon a gate pad 206. A drain terminal D1 thereof is electrically connected to and mounted upon a drain pad 210, and a source terminal S1 is electrically connected to and mounted upon a source pad 208. The high voltage device 202, which as mentioned above is a lateral device is rotated or flipped such that the gate, source and drain terminals, G1, S1, D1, are contacted with and mounted on the respective gate, source and drain pads 206, 208 and 210. This flipped or inverted orientation of the high voltage device 202 reduces parasitics such as inductance and resistance. The reduction in parasitics results from the direct connection of the gate, source and drain terminals, G1, S1, D1, mounted on the respective gate, source and drain pads 206, 208 and 210 which reduces the distance therebetween and thus reducing parasitic spreading resistances and inductances.

Figure 1:
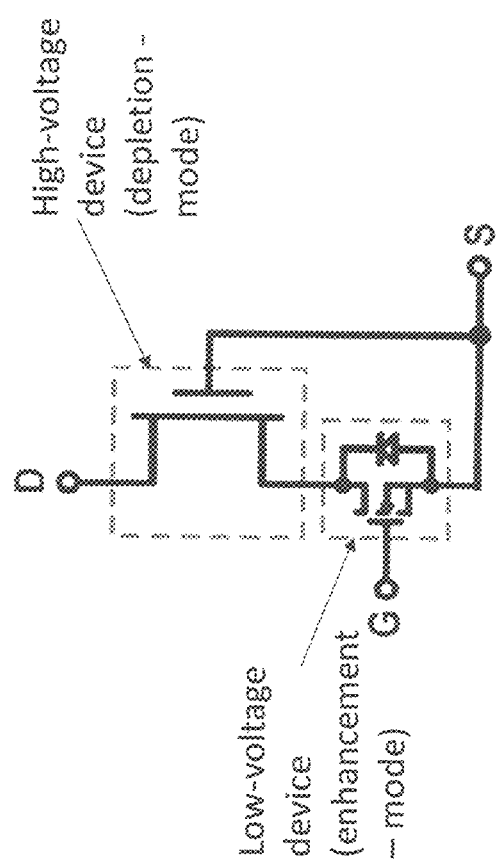
FIG. 1 is circuit diagram of a known cascode connection of high and low voltage transistors.

The low voltage device 204 is electrically connected to and mounted on the source pad 208. The source pad 208 is dimensioned such that as well as having the source terminal of the high voltage device mounted thereon, the low voltage device 204 is also mounted thereon. In this regard, a drain terminal D2 of the low voltage device is electrically connected to the source pad 208, which is in turn connected to the source terminal of the high voltage device 202. In this way, the drain terminal D2 of the low voltage device 404 to the source terminal S1 of the high voltage device 202 so that the cascode arrangement as described above with respect to FIG. 1 is achieved.

Each of the gate, source and drain pads 206, 208 and 210 are arranged so as to be co-planar, that is the surface of the gate, source and drain pads 206, 208 and 210 onto which the high voltage and low voltage devices 202, 204 are mounted and connected are in the same plane.

From the above discussion, the skilled person will therefore see that the high voltage device 202 and the low voltage device 204 are mounted side by side. This side by side arrangement, together with the inverted arrangement of the high voltage device 202, allows for the provision of an optional additional electrical connection, drain-source pin 216 (discussed in more detail below) thereby providing electrical access to mid node (drain-source connection) of the cascode arrangement. This allows for measurement of device parasitics, electrical connections and operational parameters of the device during use.

The low voltage device 204 is arranged such that a drain terminal D2 is arranged on a first, or bottom side of the device and a gate terminal G2 and a source terminal S2 are arranged on a second or top side, opposite side to the first side of the low voltage device 204. In this regard the low voltage device 204 may be a vertical device.

The source terminal S2 of the low voltage device 204 is electrically connected to the gate terminal G1 of the high voltage device 202 so that the cascode arrangement as described above with respect to FIG. 1 is achieved. An elongate clip member 212 may be electrically connected to the source terminal S2 of the low voltage device 204. The clip member 212 extends to connect the gate pad 206 which is in turn connected to the gate terminal G1 of the high voltage device. The gate pad 206 may be formed as an elongate conductive member, forming one or more source leads 214 of the semiconductor device 200 and may extend from the location where is connects to the gate terminal G1 of the high voltage device 220 to a location proximal, but electrically and spatially separated from the source terminal S1 of the low voltage. In this way, the gate pad 206 has an area greater than the gate terminal G1 of the high voltage device 202 and the gate pad 206 integrally forms one or more external source leads 214 of the semiconductor device 200. In the illustrated example the gate pad 206 is shown to be "L" shaped, however, the skilled person will appreciate that it may have alternative shapes as required by the package outline of the semiconductor device 200. The electrical and spatial connection of the source S2 of low voltage device 204 to the gate pad and the source leads 214 is achieved by the clip member 212. Through the use of the clip member 212 the common gate source connection required by the cascode arrangement as described above is provided.

As mentioned above, the drain terminal D2 of the low voltage device 204 is formed on a bottom surface thereof and is electrically and mechanically mounted on the source pad 208. In this way the common low voltage device 204 drain to high voltage device 202 source connection, as required by the cascode configuration is achieved. As with the gate pad 206, the source pad 208 may be formed as an elongate conductive member and have an area such that the source S1 of the high voltage device and the drain D2 of the low voltage device can be mounted thereon. In this way the low voltage device 204 is electrically and mechanically connected to the source pad 208.

Optionally, and as illustrated, the source pad 208 may include an integrally formed drain-source pin 216 which may be used to electrically test or check the high voltage 202 source S1 to low voltage device drain connection. The test or check allows for measurement of electrical parasitics. In addition, the gate pad 206 may optionally include an additional lead 224 which is arranged to check the high voltage device 203 gate G1 to low voltage device 204 source S2 connection. The additional lead 224 also allows for measurement of parasitics between the source S1 of the high voltage device and the drain D2 of the low voltage device.

The gate terminal G2 of the low voltage device 204 is arranged on the top surface thereof, that is on the same surface as the source terminal S2 of the low voltage device 204. A gate lead 218 is arranged proximal to and spatially separated from the gate terminal G2. The gate terminal G2 is electrically connected to the gate lead 218 by means of a ferrite element 220. The ferrite element 220 is a frequency dependent resistor and in embodiments it serves to reduce the current lowing to the gate so as to reduce so-called gate bounce at the gate terminal G2 during operation of the semiconductor device 200.

As mentioned above, the drain terminal D1 of the high voltage device 202, as connected to drain pad 210 integrally comprises one or more drain leads 222 of the semiconductor device 200. As with the gate pad 206, the drain pad 210 is formed of and elongate conductive member and is arranged to connect to the drain terminal of the high voltage device 202 and provide support for the high voltage device 202.

The gate lead 218, one or more source leads 214, one or more drain leads 222 and optional leads 216, 224, form the external leads of the semiconductor device 200 and are configured and arranged for connection contacts of an external carrier such as a PCB (not illustrated). As can be seen from FIG. 2a, the connection of the gate terminal G1 is made directly to the source leads 214 without an intermediate connection. In this way the gate pad 206 is integrally formed with the one or more source leads 214 of the semiconductor device 200. Likewise the connection of the drain terminal D1 is made directly to the drain leads 222 without intermediate connection. In this way the drain pad is integrally formed with the one or more drain leads 222 of the semiconductor device 200. The arrangement of gate pad 206, source pad 208 and drain pad 210 forms a lead frame to mountably support the high voltage device 202.

The integral connection of the gate pad 206 with the one or more source leads 214 may be achieved by using a single piece of electrically conductive material. For example the elongate gate pad 206 comprising the source leads may be formed by any appropriate process, such as stamping a sheet of conductive material to the desired dimensions. The drain pad 210 comprising the integral one or more drain leads 222, the source pad 208 comprising the optional drain-source lead 216 and the gate lead 218 may be similarly stamped from a single piece of material thus having equal thickness so that the gate G1, source S1 and drain D1 of the high voltage device 202 and the drain of the low voltage device 204 are contacted to the respective pads in a common plane, as discussed in more detail below with respect to FIG. 2d and FIG. 2e.

Furthermore, the inverted, or flipped, orientation of the high voltage device 202 together with the adjacent placement of the low voltage device, as discussed above, results in a cascode arrangement where additional isolation materials such as ceramic or DBC can be avoided.

FIG. 2b shows an additional feature when compared to the arrangement of FIG. 2a. Prior to the moulding process for forming the final and completed semiconductor device, discussed in more detail below, an optional heat sink element 226 may be included on the backside of the high voltage device 202, that is the side of the high voltage device 202 opposite to the side on which the source S1, gate G1 and drain D1 terminals are formed. The heat sink element may be formed of a conductive material and is configured and arranged to dissipate heat from the high voltage device 202 during operation. As mentioned above, the high voltage device 204 is arranged in the semiconductor device 200, such that the source S1, gate G1 and drain D1 terminals are in direct contact with respective source, gate and drain pads 208, 206, 210 and there are no electrical terminals on the opposite side of the high voltage device. Therefore, the sink element 226 may be placed directly on the high voltage device 202 as illustrated without the need to electrically isolate the backside of the high voltage device 202 from the heatsink element 226. This direct placement of the heatsink element 226 allows for more efficient dissipation of heat during operation of the semiconductor device.

FIG. 2c illustrates a plan view of the underside the semiconductor device 200 according to embodiments and shows the arrangement of the gate, source and drain pads 206, 208, 210 and gate lead 218 in the eventually encapsulated 226 device. The encapsulation process is briefly discussed in more detail below. As can be seen from FIG. 2c, the gate pad 206 is formed of two arms and is effectively "L" shaped. A first arm 229 of the L shaped gate pad 206 forms the contact position for the gate terminal G1 of the high voltage device 202. A second arm 230 of the L shaped gate pad 206 forms a source connection for connecting the source S2 of the low voltage device 204, via the clip member 212 (not illustrated in FIG. 2c) to the gate pad 206. Also illustrated is the gate lead 218, the one or more source leads 214, the one or more drain leads 222 and the optional leads 216, 224. In this regard the package outline may be considered as a quad-flat no lead (QFN) package, however the package outline may also be a dual-flat no lead (DFN) packages.

Figure 2D:
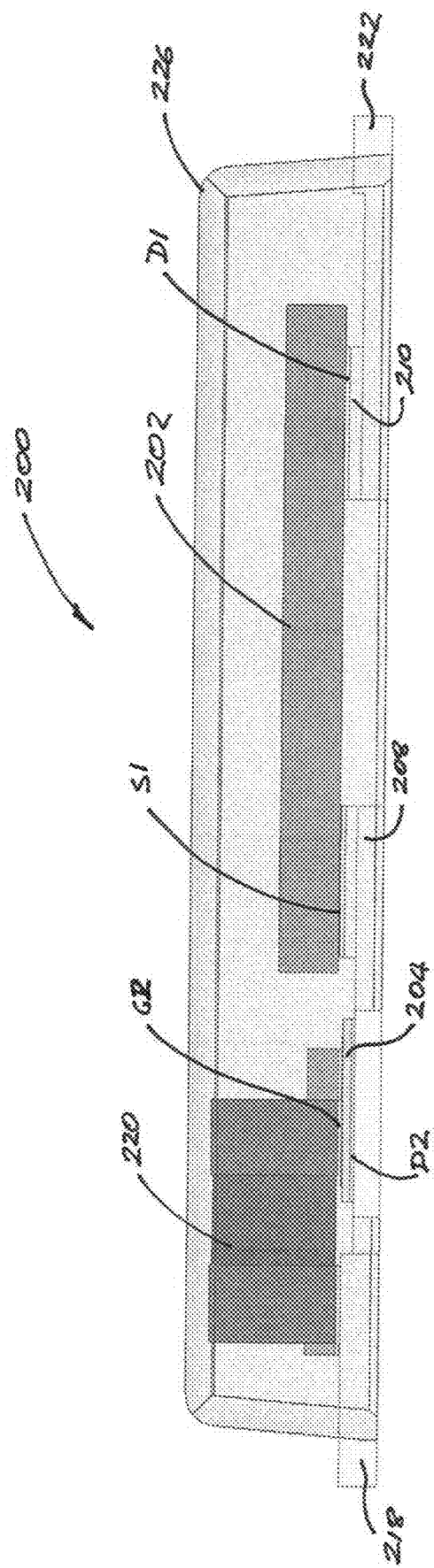
FIG. 2d illustrates a first side view of the semiconductor device according to embodiments.

FIG. 2d illustrates a first side view of the semiconductor device 200 according to embodiments and shows the arrangement of the high voltage device 202, the low voltage device and the ferrite element 220 in the eventually encapsulated 228 device. As discussed above, with reference to FIG. 2a, the high voltage device 202 is the drain terminal D1 thereof is electrically connected to and mounted upon a drain pad 210, and a source terminal S1 is electrically connected to and mounted upon a source pad 208. The drain terminal D2 of the low voltage device 204 is electrically connected to and mounted on the source pad 208. The gate terminal G2 is electrically connected to the gate lead 218 by means of the ferrite element 220.

In the location where the low voltage device 204 is mounted on the source pad 208, the source pad may comprise a recessed or cutaway portion such that when the low voltage device 204 is so mounted, the top surface of the low voltage device 204 (that surface comprising the source S2 and gate G2 terminals will be substantially level with the surface of the source pad 208 on which the source terminal S1 of the high voltage device 202 is mounted. Likewise the surface of the low voltage device 204 comprising the source S2 and gate G2 terminals may also be substantially level with a top surface of the gate lead on which one end of the ferrite element 220 is mounted. This ensures good co-planarity of the as mounted ferrite element 220. As illustrated in FIG. 2d, the ferrite element 220 is directly attached to the gate terminal G2 of the low voltage device 204 thus removing any parasitic inductances or resistances associated with any intermediate interconnection such as a bond wire.

Figure 2E:
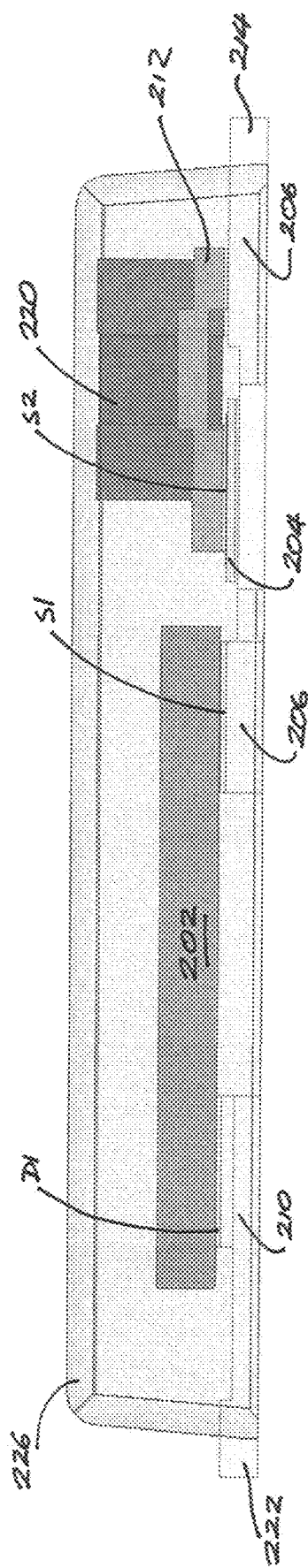
FIG. 2e illustrates a second side view of the semiconductor device according to embodiments.

FIG. 2e illustrates a second side view of the semiconductor device 200 according to embodiments and shows the arrangement of the high voltage device 202, the low voltage device and the clip member 212 in the eventually encapsulated 228 device. As discussed above, the top surface of the low voltage device 204 comprising the gate G2 terminal may also be substantially level with a top surface of the gate pad 206 where the clip member 212 is attached thereto. This allows for ease of manufacture of the semiconductor device 200 according to embodiments together with reducing any parasitic inductances or resistances associated with any intermediate interconnection such as a bond wire. Through the use of the clip member 212 connecting the source terminal S2 of the low voltage device 204 to the gate terminal G1 of the high voltage device, via the L shaped gate pad 206, $R_{DSon}$ may be improved by the use of lower resistance and lower inductance (when compared to wire bonds) clip members.

An example method of assembling the semiconductor device 200 according to embodiments will be described with reference to FIGS. 3a to 3f.

Prior to the assembly of the semiconductor device 200, each of the source, gate and drain pads 208, 206, 210 and gate lead 218 may be formed from a unitary piece of conductive material as is understood in the art. One example method of forming the respective pads and leads is stamping a piece of metallic, conductive material. The stamping process defines the respective outlines of the pads and may also define any recessed or cutaway portions in the pads or leads as required.

The respective source, gate and drain pads 208, 206, 210 and gate lead 218 are illustrated in FIG. 3a and form the starting point for the method of assembly according to embodiments. In order to mechanically and electrically attach the drain terminal D2 of the low voltage device 204 to the source pad 208, an adhesive attach material 302 is dispensed thereon. The drain terminal D2 of the low voltage device 204 is then attached to the source pad 208 using the die attach material 302 as illustrated in FIG. 3b.

Following attachment of the low voltage device 204 to the source pad 208 a further adhesive material 306 is dispensed on the gate and source terminals G2, S2 of the low voltage device 204, for later attachment of the clip member 212 and the ferrite element 220. In addition, a further adhesive material 304 is dispensed on the source gate and drain pads 208, 206, 210 for attachment of the respective source, gate and drain terminals S1, G1, D1 of the high voltage device 202 thereto. As illustrated in FIG. 3d, the source, gate and drain terminals S1, G1, D1 of the high voltage device 202 are attached to the adhesive material 304 of the respective source gate and drain pads 208, 206, 210. The ferrite element 220 may be also be attached to the adhesive material 304 on the gate G2 of the low voltage device 204 and the gate lead 218. The clip member is then attached to the adhesive material 306 on source terminal S2 of the low voltage device and the gate pad 206.

The adhesive attach material 302, 304, 306 may be a solder material or conductive material or a combination of these materials. Dispensing of the adhesive attach material 302, 304, 306 may be carried out by stencil printing, screen printing, syringe dispense or preformed solder or die attach using sintering, or any combination thereof.

Following the above processes the semiconductor device 200 may then undergo standard processing techniques. For example, the semiconductor device may be reflowed or cured or set the adhesive material 302, 304, 306 and then encapsulated using a mould material 228. Optionally, the semiconductor device 200 may undergo further processes such as trim-form singulation and plating of the leads.

Figure 4A:
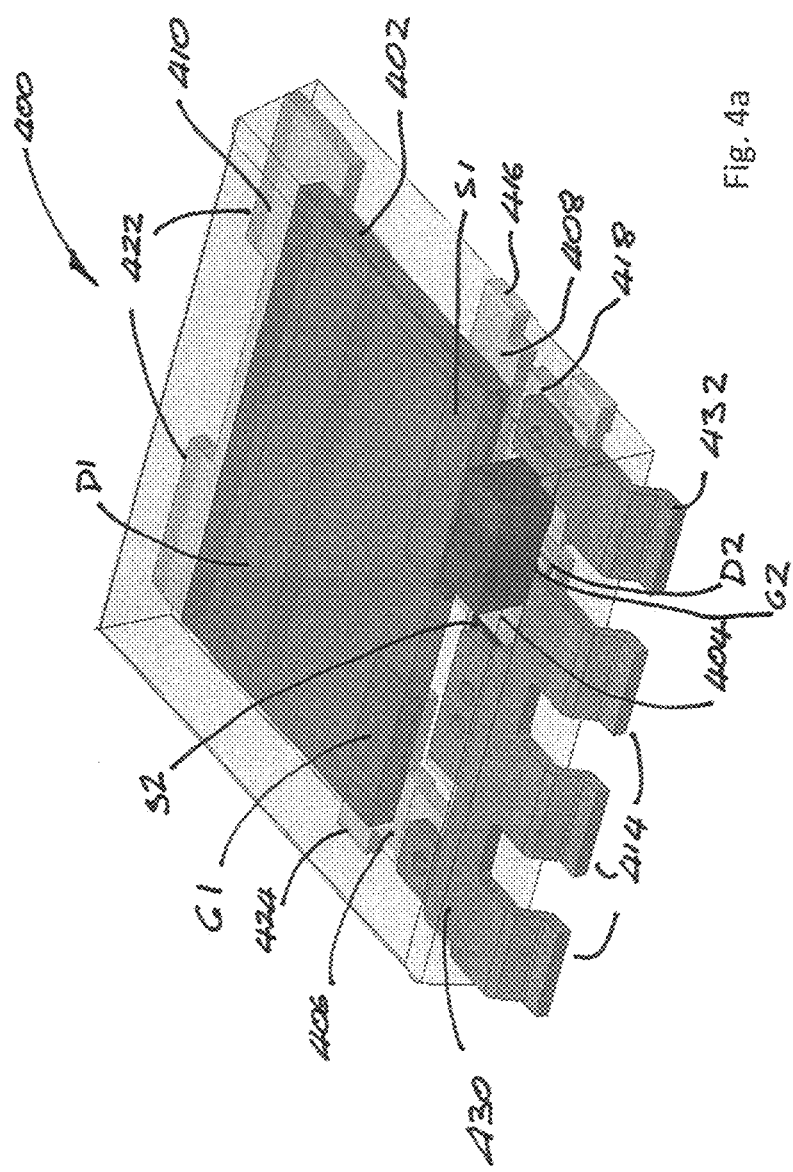
FIG. 4a illustrates an isometric view of the semiconductor device according to embodiments.

FIG. 4a illustrates a semiconductor device 400 according to an embodiment. In common with the arrangement of FIGS. 2a to 2e, the semiconductor device 400 comprises a high voltage device 402 and a low voltage device 404. The high voltage device 202 may be a depletion mode, or normally on, HEMT or JFET, for example a GaN or SiC device and the low voltage device 404 may be an enhancement mode, or normally off, MOSFET.

The high voltage device 402 and low voltage device 404 are separate device dies. The high voltage and low voltage devices 402, 404 are configured and integrated within a single package to form the semiconductor device 400 according to embodiments.

High voltage devices 402, such as HEMTs are formed with gate, source and drain terminals on a top surface thereof and are thus considered to be lateral devices, as opposed to vertical devices, where at least one of the terminals is formed on a bottom surface, opposite to the top surface.

The semiconductor device 400 comprises various contact pads for mounting each of the high and low voltage devices 402, 404 and making electrical connections to the terminals of those devices.

With regard to the high voltage device 402, a gate terminal G1 thereof is electrically connected to and mounted upon a gate pad 406. A drain terminal D1 thereof is electrically connected to and mounted upon a drain pad 410, and a source terminal S1 is electrically connected to and mounted upon a source pad 408. The high voltage device 402, which as mentioned above is a lateral device is rotated or flipped such that the gate, source and drain terminals, G1, S1, D1, are contacted with and mounted on the respective gate, source and drain pads 406, 408 and 410.

This flipped or inverted orientation of the high voltage device 402 improves parasitics such as inductance and resistance as discussed above.

The low voltage device 404 is electrically connected to and mounted on the source pad 408. The source pad 408 is dimensioned such that as well as allowing for the source terminal of the high voltage device to be mounted thereon, the low voltage device 404 is also mounted thereon. In this regard, a drain terminal D2 of the low voltage device 404 is electrically connected to the source pad 408, which is in turn connected to the source terminal S1 of the high voltage device 402. In this way, the drain terminal D2 of the low voltage device 404 to the source terminal S1 of the high voltage device 402 so that the cascode arrangement as described above with respect to FIG. 1 is achieved.

Each of the gate, source and drain pads 406, 408 and 410 are arranged so as to be co-planar, that is the surface of the gate, source and drain pads 406, 408 and 410 onto which the high voltage and low voltage devices 402, 404 are mounted and connected are in the same plane. The gate, source and drain pads 406, 408 and 410 provide mechanical support for the high voltage device 402.

From the above discussion, the skilled person will therefore see that the high voltage device 402 and the low voltage device 404 are mounted side by side.

The low voltage device 404 is arranged such that a drain terminal D2 is arranged on a first, or bottom side of the device and a gate terminal G2 and a source terminal S2 are arranged on a second or top side, opposite side to the first side of the low voltage device 404. In this regard the low voltage device 404 may be a vertical device.

The source terminal S2 of the low voltage device 404 is electrically connected to the gate terminal G1 of the high voltage device 202 so that the cascode arrangement as described above with respect to FIG. 1 is achieved. In comparison to the arrangement of, the arrangement FIGS. 2a to 2e of FIG. 4a does not make use of an elongated "L" shaped gate pad 206 to electrically connect the source terminal S2 of the low voltage device 204 to the gate terminal G1 of the high voltage device 202. In the arrangement of FIG. 4a, the electrical connection of the source terminal S2 to the gate terminal G1 is achieved by a source clip 430. The source clip 430 is a substantially elongate member and extends between the source terminal S2 of the low voltage device 204 and the gate pad 406 so that the cascode arrangement as described above with respect to FIG. 1 is achieved. In addition to providing the source terminal S2 to gate terminal G1 connection, the clip member comprises one or more source 414 leads to provide one or more external source leads of the semiconductor device 400.

The drain terminal D1 of the high voltage device 402, is connected to drain pad 410 and integrally comprises one or more drain leads 422 of the semiconductor device 400.

The gate terminal G2 of the low voltage device 404 is arranged on the top surface thereof, that is on the same surface as the source terminal S2 of the low voltage device 404. A gate pad 418 is arranged proximal to and spatially separated from the gate terminal G2. The gate terminal G2 is electrically connected to the gate pad 418 by means of a ferrite element 420. The ferrite element 420 serves to reduce so-called gate bounce at the gate terminal G2 of the low voltage device during operation of the semiconductor device 200.

In the arrangement of FIG. 4a, the electrical connection of the gate pad 418 to form an external electrical connection to the gate terminal G2 of the low voltage device 404 is achieved by means of a gate clip 432 electrically and mechanically attached to the gate pad 418.

The drain terminal D1 of the high voltage device 402, as connected to drain pad 410 integrally comprises one or more drain leads 422 of the semiconductor device 400. The drain pad 410 is formed of and elongate conductive member and is arranged to connect to the drain terminal of the high voltage device 402 and provide mechanical support for the high voltage device 402.

In common with the arrangement of FIGS. 2a to 2e, the arrangement of FIG. 4a may also optionally and as illustrated, the source pad 408 may include an integrally formed drain-source lead 416 which may be used to check the high voltage 402 source S1 to low voltage device drain connection. In addition, the gate pad 406 may optionally include an additional lead 424 which is arranged to check the high voltage device 402 gate G1 to low voltage device 404 source S2 connection.

The gate lead 432, one or more source leads 414, one or more drain leads 422 and optional leads 416, 424, form the external leads of the semiconductor device 400 and are configured and arranged for connection contacts of an external carrier such as a PCB (not illustrated).

Figure 4B:
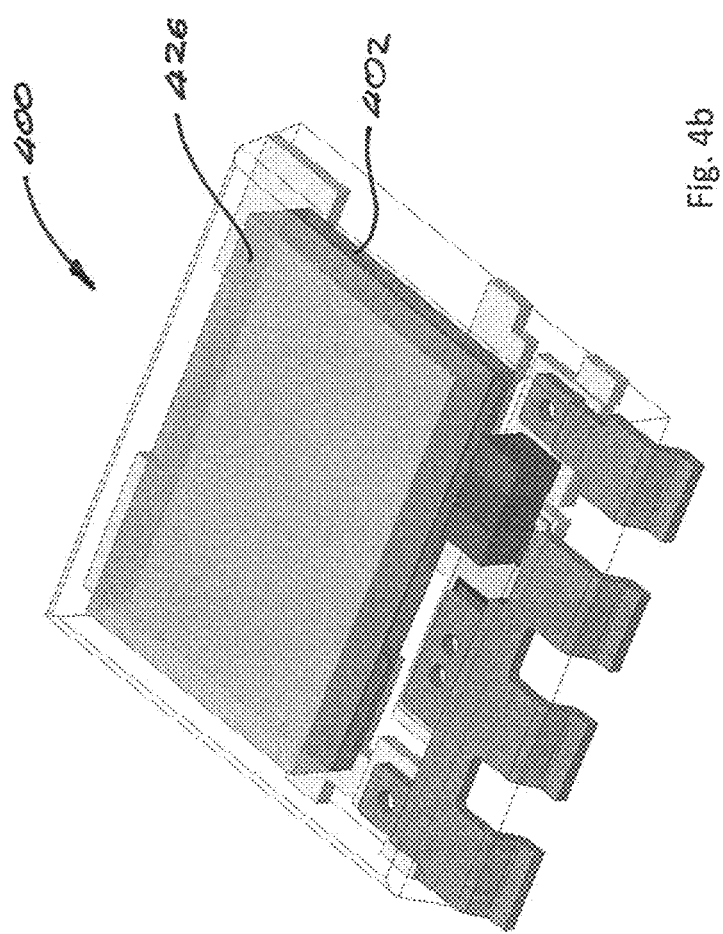
FIG. 4b illustrates an isometric view of the semiconductor device according to embodiments and comprising a heat sink element.

FIG. 4b shows an additional feature when compared to the arrangement of FIG. 4a. in common with the arrangement of FIG. 2b an optional heat sink element 426 may be included on the backside of the high voltage device 402, that is, the side of the high voltage device 402 opposite to the side on which the source S1, gate G1 and drain D1 terminals are formed.

Figure 4C:
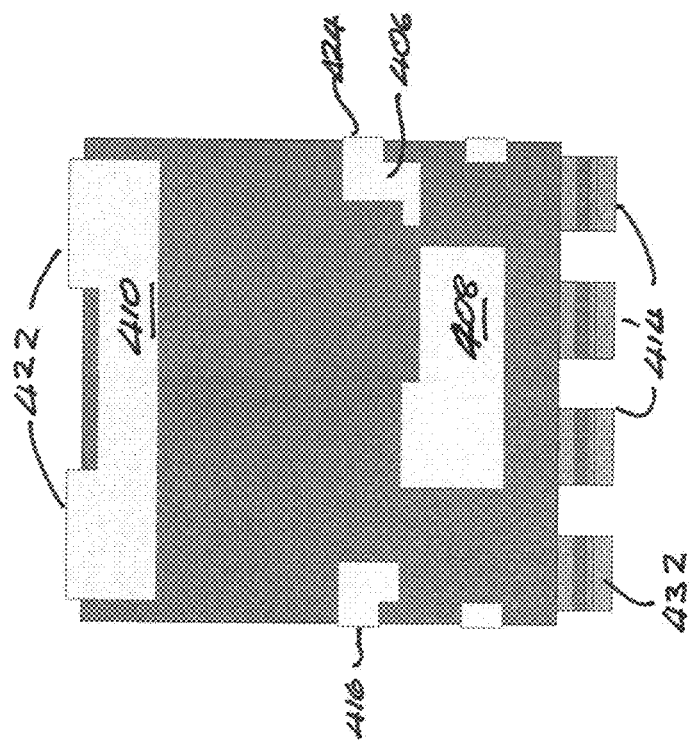
FIG. 4c illustrates a bottom view of the semiconductor device according to embodiments.

FIG. 4c illustrates a plan view of the underside the semiconductor device 400 according to embodiments and shows the arrangement of the gate, source and drain pads 406, 408, 410 in the eventually encapsulated 426 device. Also illustrated is the gate lead 432, the one or more source leads 414, the one or more drain leads 422 and the optional leads 416, 424. In this regard the package outline may be considered as an LFPAK package type.

The method of assembling the semiconductor device 400 according to the arrangement of FIGS. 4a to 4c is similar to that as described above with reference to FIGS. 3a to 3f.

On the basis of the above described embodiments, the skilled person will see that the semiconductor device 200, 400 mitigates disadvantages associated with wire bonded based interconnects used in conventional cascode connected high and low voltage devices. In particular, the use of common bond pads forming common electrical and mechanical connection, namely high voltage device gate to low voltage source, and low voltage device drain to high voltage source, results in improved power efficiency, buy making better connections and thus reducing inductances in those connections.

Furthermore, the inverted or flipped placement of the high voltage device allows for removal of ceramic insulation required in known stacked without significant changes in thermal performance of the device during operation.

Yet further, the reduction of parasitic inductances also improves switching power losses as the inductance between the high voltage device 202 and external circuitry connected to the semiconductor device 200, 400 is reduced due to the inverted nature and direct connection of the high voltage device 202 to the respective leads of the semiconductor device. Moreover, by the direct connection of the ferrite element 220 to the gate of the low voltage device, the area of the semiconductor device will be reduced, whilst also minimising gate bounce by eliminating the need for conventional wire bonds within the semiconductor device.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A discrete semiconductor device comprising:
a high voltage depletion mode device;
a low voltage enhancement mode device connected in cascode configuration with the high voltage depletion mode device;
wherein the high voltage depletion mode device further comprises a gate terminal, a source terminal, and a drain terminal arranged on a surface thereof;
wherein the low voltage enhancement mode device further comprises a gate terminal, a source terminal, and a drain terminal arranged on a surface thereof;
wherein the gate terminal, source terminal, and the drain terminal of the high voltage depletion mode device are inverted with respect to the low voltage enhancement mode device so that the gate terminal, the source terminal, and the drain terminal of the high voltage depletion mode device are mounted on and contact respectively the gate terminal, the source terminal, and the drain terminal of the low voltage enhancement mode device; and
wherein the low voltage enhancement mode device is arranged adjacent to the high voltage depletion mode device.

2. The discrete semiconductor device according to claim 1, wherein the high voltage depletion mode device is a lateral device; and wherein the low voltage enhancement mode device is a vertical device.

3. The discrete semiconductor device of claim 1, wherein the source terminal of the high voltage depletion mode device and the drain terminal of the low voltage enhancement mode device are fixedly and electrically connected to a common bond pad.

4. The discrete semiconductor device of claim 2, wherein the source terminal of the high voltage depletion mode device and the drain terminal of the low voltage device are fixedly and electrically connected to a common bond pad.

5. The discrete semiconductor device of claim 1, wherein the gate terminal of the high voltage depletion mode device and the source terminal of the low voltage device are electrically connected by a conductive clip member.

6. The discrete semiconductor device of claim 5, wherein the conductive clip member is fixedly and electrically connected to the source terminal of the low voltage enhancement mode device and fixedly and electrically connected to the gate terminal of the high voltage device.

7. The discrete semiconductor device of claim 1, further comprising a ferrite element fixedly and electrically connected to the gate terminal of the low voltage enhancement mode device and a gate lead of the semiconductor device.

8. The discrete semiconductor device of claim 1, wherein the high voltage depletion mode device is a transistor selected from the group consisting of a GaN based transistor, a GaN based HEMT, and a SiC transistor.

9. The discrete semiconductor device of claim 1, further comprising a low-voltage enhancement-mode transistor that is a field effect transistor.

10. The discrete semiconductor device of claim 1, wherein the low voltage enhancement mode device is a MOSFET.

11. A method of manufacturing a discrete semiconductor device, the method comprising the steps of:
providing a high voltage depletion mode device having a source terminal, and a drain terminal formed on a surface thereof;
providing a low voltage enhancement mode device connected in cascode configuration with the high voltage depletion mode device, the low voltage enhancement mode device further comprises a gate terminal, a source terminal, and a drain terminal arranged on a surface thereof;
mounting the high voltage depletion mode device so that the gate, source and drain terminals are inverted with respect to the low voltage enhancement mode device so that the gate terminal, the source terminal, and the drain terminal of the high voltage depletion mode device are mounted on and contact respectively the gate terminal, the source terminal, and the drain terminal of the low voltage enhancement mode device; and
arranging the low voltage enhancement mode device adjacent the high voltage depletion mode device.

12. The method of claim 11, further comprising the steps of: fixedly and electrically connecting the source terminal of the high voltage depletion mode device and the drain terminal of the low voltage enhancement mode device to a common bond pad.

13. The method of claim 11, further comprising the steps of: electrically connecting the gate terminal of the high voltage depletion mode device and the source terminal of the low voltage enhancement mode device by a conductive clip member.

14. The method of claim 12, further comprising the steps of: electrically connecting the gate terminal of the high voltage depletion mode device and the source terminal of the low voltage enhancement mode device by a conductive clip member.

15. The method of claim 13, further comprising the steps of: fixedly and electrically connecting the conductive clip member to the source terminal of the low voltage enhancement mode device and fixedly and electrically connecting the conductive clip member to the gate terminal of the high voltage depletion mode device.

16. The method of claim 11, further comprising the steps of: fixedly and electrically connecting a ferrite element to the gate terminal of the low voltage enhancement mode device and a gate lead of the semiconductor device.

17. The method of claim 11, wherein the high voltage depletion mode device is a lateral device, and wherein the low voltage enhancement mode device is a vertical device.

18. The method of claim 15, further comprising the steps of: fixedly and electrically connecting a ferrite element to the gate terminal of the low voltage enhancement mode device and a gate lead of the semiconductor device.

* * * * *